United States Patent [19]

Holmes et al.

[11] Patent Number: 5,015,862

[45] Date of Patent: May 14, 1991

[54] LASER MODULATION OF LMI SOURCES

[75] Inventors: J. Fred Holmes, Portland; Jonathan H. Orloff, Lake Oswego, both of Oreg.; Karl J. Jousten, Berlin, Fed. Rep. of Germany

[73] Assignee: Oregon Graduate Institute of Science & Technology

[21] Appl. No.: 467,971

[22] Filed: Jan. 22, 1990

[51] Int. Cl.$^5$ ............................................. H01J 27/00
[52] U.S. Cl. ........................... 250/423 R; 250/423 P; 250/423 F; 250/306; 250/307; 250/424; 250/425
[58] Field of Search ............... 250/423 R, 423 F, 306, 250/307, 305, 424, 425

[56] References Cited

U.S. PATENT DOCUMENTS

| | | | |
|---|---|---|---|
| 3,294,970 | 12/1966 | Jenckel | 250/423 R |
| 3,864,572 | 2/1975 | van der Mast et al. | 250/306 |
| 4,259,572 | 3/1981 | Brunnee et al. | 250/423 R |
| 4,296,322 | 10/1981 | Wechjung | 250/423 R |
| 4,686,414 | 8/1987 | McKenna et al. | 250/423 R |

OTHER PUBLICATIONS

Menz et al., Das Neue Doppelkapillarviskosimeter und Kritische Dutchsieht mir Neusen Messungen der n Werte Reiner Metall, Nov. 1966, p. 15, table 8.
Gromer, On the Mechanism of Liquid Electron and Ion Sources Applied Physics 19, 1979.
Swanson et al., Measurement of the Energy Distribution of a Gallium Liquid Metal Ion Source, Jul. 1980.
Swanson, Recent Advantages in Liquid Metal Ion Source, Oct. 1980.
Thompson et al., The Dynamics of Liquid Metal Ion Source Applied Physics 17, 1984.
Kingham et al., Shape of a Liquid Metal Ion Source, Applied Physics A34, 1984.
Mair, Theoretical Determination of Current-Voltage Curves for Liquid Metal Ion Source, Applied Physics 17, 1984.
Bemassayag et al., In Situ High Voltage Term Observation Ojan Electrohydrodynamic (EHD) Ion Source, Ultramicroscopy 16, 1985.
Kingham and Swanson, Theoretical Investigation of Liquid Metal Ion Sources: Field and Temperature Dependence of Ion Emission, Applied Physics A41, 1986.
Swanson et al., On the Mechanism of Liquid Metal Ion Sources Applied Physics A41, 1986.
Bell et al., The Influence of Substrate Geometry on the Emission Properties of a Liquid Metal Ion Source, Applied Physics A41, 1986.
Bartholomeusz, Thermal Response of a Laser-Irradiated Metal Slab Journal Applied Physics 64, Oct. 15, 1988.
Swanson et al., The Influence of Electrode Geometry on Liquid Metal Ion Source Performance, Journal of the American Vacuum Society, Jul./Aug. 1988.
Mair, On the Origin of Fast Current Fluctuations in Liquid Metal Ion Source, Applied Physics 21, 1988.
Hornsey et al., The Effects of Source Temperature and Characteristics on the Optical Emission from a Gallium Liquid Metal Ion Source IOP Publishing Ltd. 1989.

*Primary Examiner*—Jack I. Berman
*Assistant Examiner*—Kiet T. Nguyen
*Attorney, Agent, or Firm*—Kolisch, Hartwell, Dickinson, McCormack & Heuser

[57] ABSTRACT

A method for modulating a liquid metal ion source includes generating an ion beam, directing a light beam at the liquid metal ion source and inducing a modulation in the ion beam by modulating the light beam.

An apparatus for carrying out the invention includes a light beam source for generating a light beam, a modulator for modulating the light beam and a mechanism for directing the modulated light beam at the light metal ion source.

12 Claims, 9 Drawing Sheets

5,015,862

LASER MODULATION OF LMI SOURCES

BACKGROUND OF THE INVENTION

This invention relates to Liquid Metal Ion (LMI) sources, and particularly to a method and apparatus for modulating an LMI source.

Focussed Ion Beam (FIB) micromachining or milling is presently conducted in an open loop manner. This means that the desired structure is laid out using conventional methods, a beam control program is written off-line and entered into a control computer which generates the FIB raster pattern for the milling process. In order to determine if the process has been properly carried out, the FIB may be used like a scanning electron microscope (SEM) for inspection of the workpiece, or, the milled workpiece may be removed from the milling station and placed in a SEM for post milling examination. In the event that further micro-machining is required, the workpiece must then be replaced in the milling station with proper registration and the process repeated or continued.

A raster pattern controls the FIB to hold the FIB over those areas which are intended for more intense milling for a longer period of time, while passing the FIB over those areas which require less milling in a shorter time span. Following each micro-machining process, the workpiece may be inspected again, such as by a scanning electron microscope. A FIB may be generated using an LMI source. Modulation of the LMI source will result in modulation of the FIB to further control the rate/depth of the micromachining or milling process.

An object of the invention is to provide an apparatus and method for modulating a liquid metal ion source.

Another object of the invention is to provide an apparatus and method for modulating an ion beam which is generated by a liquid metal ion source using a light beam source.

A further object of the invention is to provide a method and apparatus for controlling a FIB system to modulate the ion column to control a milling process.

Yet another object of the invention is to provide an apparatus and method for modulating a FIB to allow control of the depth of the milling of the work piece independently of the raster scanning rate.

SUMMARY OF THE INVENTION

The method of the invention for modulating a liquid metal ion source includes generating an ion beam with a LMI source, directing a light beam at the liquid metal ion source and inducing a modulation in the ion beam by modulating the light beam.

The apparatus of the invention includes a light beam source for generating a light beam, a modulator for modulating the light beam and a mechanism for directing the modulated light beam at the liquid metal ion source.

These and other objects are the advantages of the invention apparent as the description which follows read in conjunction with the drawings.

BRIEF DESCRIPTION OF THE DRAWINGS

FIG. 2 is a greatly enlarged elevation of a liquid metal ion source tip of FIG. 1a.

DETAILED DESCRIPTION OF THE PREFERRED EMBODIMENTS

Figure 1:
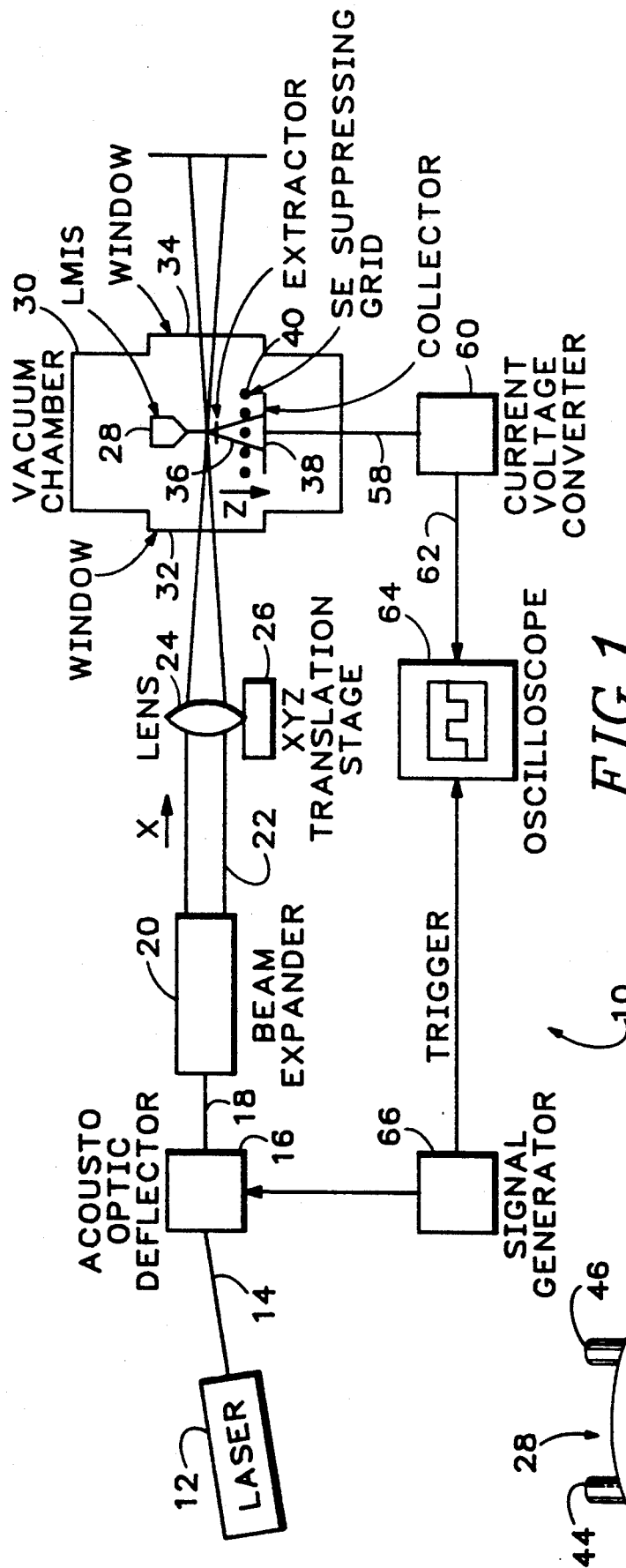
FIG. 1 is a somewhat diagrammatic representation of an apparatus for modulating a liquid metal ion source.

Turning now to the drawings, and initially to FIG. 1, the apparatus of the invention is depicted generally at 10. Apparatus 10 includes a light beam generator (laser) 12, which, in the preferred embodiment, is an argon multi-line mode device which operates in the range of 450–530 nm. Beam 14 is directed towards a acousto-optic deflector 16, which amplitude modulates laser beam 14. The modulated beam 18 is directed towards a beam expander 20, which is used to control the spot size of the modulated beam 18. In the preferred embodiment, beam expander 20 is capable of expanding beam 18 by a factor of 10×, thereby providing a beam which can be focused to a spot size of approximately of $10\mu m$. Expanded beam 22 is directed through a lens 24 which is located on an xyz translation stage 26. Lens 24 focusses the laser beam onto the liquid metal ion (LMI) source tip. Translation stage 26 provides an aiming mechanism for directing the point of focus of the expanded, modulated beam 22, towards its target. Specifically, movement of the stage in the y and z directions provide an aiming mechanism, while movement of the stage in the x direction allows adjustment of the location in the x direction where the laser beam is focused.

A liquid metal ion (LMI) source 28 is enclosed in a vacuum chamber 30. The chamber has a pair of opposed windows 32, 34 which allow viewing of the LMI source and entry of beam 22 into the chamber. Source 28 is operable to produce an ion beam 36 which is directed at a collector plate 38, and which passes though a secondary electron (SE) suppressing grid 40.

Figure 1A:
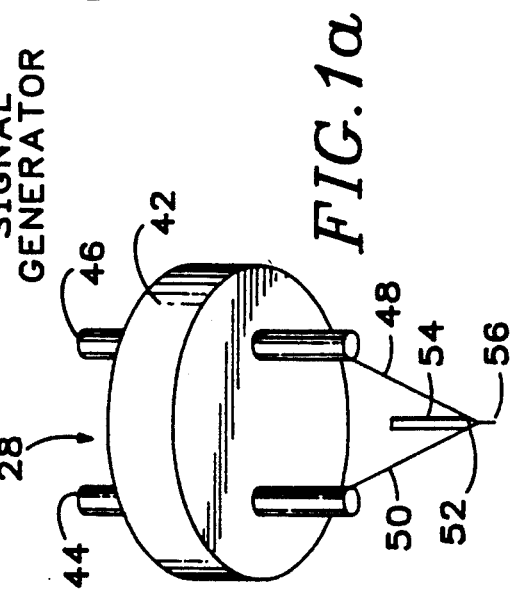
FIG. 1a is a greatly enlarged side view of a liquid metal ion source.

Referring momentarily to FIG. 1a, source 28 is shown in greater detail and includes a base 42 having electrical connectors 44, 46 extending therethrough. A filament 48, 50 is attached to connectors 44, 46 respectively, and are joined at a point 52, where a liquid metal reservoir 54 is located. A tip 56 extends downward from reservoir 54 and, with the source in operation, emits metal ions, which are directed towards collector 38 by the applied electric field. This ion beam is not properly designated as a focused ion beam because the beam is not acted upon by an ion focusing mechanism.

Referring back to FIG. 1, a signal 58 is transmitted from collector 38 to a current/voltage converter, or amplifier 60, which in turn has an output 62, which is transmitted to an oscilloscope, or signal comparator, 64.

A signal generator 66 provides a radio frequency drive to acousto-optic deflector 16 and a synchronizing output to oscilloscope 64, which allows the oscilloscope to sweep in synchronization with the modulation of beam 14.

As previously noted, the modulation of column 36 is accomplished by changing the temperature of a liquid metal source at tip 56. The changes in temperature are accomplished by directing a laser beam at the tip, and modulating the laser beam to change the temperature at the tip. Although thermal processes are normally considered to be rather slow, because the volume of metal being acted upon is extremely small, the process can be used successfully to modulate the temperature at a relatively high rate.

A modulation frequency on the order of 10's of MHz is required for an effective instrument. Specifically, a frequency of about 40–50 MHz is desired. A simple estimation of the possible frequency may be calculated as follows.

Such a calculation may be preformed to determine the temperature change at two ends of a cylinder. Assume that the cylinder has a volume $V_1$ on one end thereof and at that the volume is heated to a temperature $T_1$. The volume $V_2$ at the other end of the cylinder is kept constant at a temperature $T_2$. $V_1$ is equivalent to the very end of the liquid metal tip 56, while $V_2$ is equivalent to the region to where there is no significant temperature change, because there is a much larger mass.

The temperature $T(t)$ of $V_1$ is given by the equation:

$$\frac{dT(t)}{dt} = \frac{\kappa A/L}{c_v V_1}(T(t) - T_2) \tag{1}$$

where $\kappa$ is the heat conductivity, A and L are the cross section and length, respectively, of the cylinder, and $c_v$ is the heat capacity per unit volume of the material. Solving Eq. (1) for $T(t)$:

$$T(t) = (T_1 - T_2)e^{-\beta t} + T_2 \tag{2}$$

where $$\beta = \frac{\kappa A/L}{c_v V_1} \tag{3a}$$

The parameter $\beta$ is the reciprocal of the thermal time constant, and is defined as the frequency at which an effective temperature change of $V_1$ may be achieved. The system is analogous to an electric RC network and, therefore, the traditional 3 db frequency change may be obtained by dividing $\beta$ by $2\pi$. To estimate $\beta$, the fact that the tip is not a cylinder, but is shaped as a cone, must be taken into consideration. For purposes of estimation, it is sufficient to increase the value of A. A reasonable value for A may be considered as the cross section at L/3 of a Taylor cone, yielding:

$$A/L \approx \pi(L/3)^2/L \approx L/3 \tag{3b}$$

An estimated value for $\beta$ of 50 MHz is based on the assumption that $V_1 = 1\mu m^3$, $L = 10\mu m$, $c_v = 2.24 \cdot 10^6 J/m^3 K$ and $\kappa = 30$ W/mK for gallium. This is greater than the desired frequency of 40 MHz.

Apparatus 10, in the preferred embodiment, uses an LMI source which is marketed by FEI Company, of Beaverton, Oreg., which includes a 180μm diameter tungsten wire, etched to a cone of 35° half angle and ending in a radius of 7μm. The wire is spot welded on a loop supporting the gallium reservoir. The loop allows the tip, including the entire shank, to be heated.

Laser beam 22 is focused onto tip 56. The spot size of the collimated Gaussian laser beam having a diameter D and focused by a lens is given by:

$$2\omega_0 = \frac{4\lambda}{\pi} \frac{f}{D} \tag{4}$$

where $\lambda$ is the wave length of the light, f the focal length of the lens and $\omega_0$ is the beam radius at which the intensity has decreased to $e^{-2}$ of its value on the axis. With lens 24 located outside of the vacuum chamber, f is restricted to values $\geq 100$ mm. The beam expander is therefor required to achieve a beam diameter less than or equal to 30μm. With the configuration depicted in FIG. 1, a beam spot size of approximately 10μm is possible at the tip of the LMI source, limited only by aberrations of the lenses and distortions of the beam created by window 32.

Adjustment of the laser beam relative to the LMI source is accomplished with the LMI source operating by optimizing the modulation frequency response of the LMI source current. The laser beam is positioned by changing the coordinates of lens 24 with translation stage 26.

Ion current is collected on collector 38, which, in the preferred embodiment is a stainless steel plate. Secondary electrons are suppressed by SE grid 40, which is held at a negative 150 volts and is located between collector plate 38 and source 28. The collected current (58) is converted to a voltage by amplifier 60. The transimpedance is set between 10kΩ and 1MΩ, depending on the frequency to be detected. The voltage signal is observed on oscilloscope 64, which is synchronized by signal generator 66. Laser beam 14 is initially chopped by an acousto-optic deflector 16, where the undeflected beam is blocked by the optical system. The chopping frequency may be varied from 1 kHz–1MHz.

It is desired to monitor the temperature of the LMI tip to further control the apparatus and process. Although it is not possible to directly measure the temperature at the very end of the tip, it is possible to calculate the temporal and spatial distribution of the temperature along the LMI source cone.

Although the geometry of the cone has a cylindrical symmetry, the heating of the cone is not symmetrical because the laser illuminates only one side of the cone. The dependence of temperature T and time t, and the spatial coordinates x,y,z in any solid, is described in differential form by the general heat conduction equation:

$$\kappa\left(\frac{\partial^2 T}{\partial x^2} + \frac{\partial^2 T}{\partial y^2} + \frac{\partial^2 T}{\partial z^2}\right) + q = c_v \frac{\partial T}{\partial t} \tag{5}$$

Here $\kappa$ is the heat conductivity, q any heat generation in the solid, which in this apparatus is introduced by the laser, and $c_v$, the heat capacity per unit volume. It should be noted that both T and q are functions of position and time. The assumption is made that $\kappa$ and $c_v$ are independent of temperature and position.

There are at least two numerical approaches which may be used to solve Eq. (5) using a finite difference approximation. In the explicit formulation, T is expanded around (x,y,z) and t, whereas the implicit version expands T around (x,y,z) and $t+\delta t$. The implicit formulation has the advantage that it is numerically stable on its own, while the explicit formulation is stable only if the chosen time step $\delta t$, for a given three dimensional problem, with discrete nodes (ijk), each representing a cube of size a, is smaller than:

$$\delta t \leq \frac{1}{6} \frac{a^2}{\kappa} c_v \qquad (6)$$

For a cube having a side $a=0.2\mu m$, $\delta t$ is already 0.25 ns, provided that the values for Gallium are the same as previously set forth for $\kappa$ and $c_v$. In order to solve Eq. (5) under these conditions, and assuming that a laser pulse has a duration of $1\mu s$, at least $10^4$ calculations for each cube have to be carried out, leading to prohibitive computing times. Therefore, the implicit formulation is preferable because the time steps $\delta t$ can, in principle, be chosen independently of the cube size.

By subdividing the cone into small cubes of size a and positions (ijk), Eq. (5) may be solved. Using $$q(x,y,z,t) = q_{ijk} \qquad (7a)$$

$$T(x,y,z,t) = T_{ijk} \qquad (7b)$$

$$T(x,y,z,t+\delta t) = T'_{ijk} \qquad (7c)$$

and a finite difference approximation to Eq. (5), the new temperature of each cube is determined by:

$$T'_{ijk} = T_{ijk} + \delta t \left( \sum_{lmn} \frac{T'_{lmn} - T'_{ijk}}{RC} + \frac{q_{ijk}}{C} \right) \qquad (8)$$

where l,m,n are neighbors of i,j,k, respectively, where $$R = 1/(\kappa a) \qquad (9a)$$

and $$C = c_v a^3 \qquad (9b)$$

are formulated in analogy to an electrical network. By re-writing Eq. (8)

$$T'_{ijk} = \frac{T_{ijk} + \delta t \left( \sum_{lmn} \frac{T'_{lmn}}{RC} + \frac{q_{ijk}}{C} \right)}{1 + p \frac{\delta t}{RC}} \qquad (10)$$

where p is the number of neighbors of the cube ijk. The new set of equations is obtained to provide new temperatures $T'_{ijk}$ in terms of the new temperatures of the neighboring points and the heat input $q_{ijk}$, once a time step $\delta t$ is chosen. Eq. (10) may be solved by iteration in the following manner:

1. An initial temperature distribution $T_{ijk}$ at time t is determined. A suitable first new distribution $T'_{lmn}$ at a time $t+\delta t$ is estimated.

2. A new $T'_{ijk}$ is calculated using the most recent values of T'.

3. The process is repeated over all cubes until:

$$|(T_{ijk})_{m+1} - (T_{ijk})_m| \leq \epsilon \qquad (11)$$

for all nodes, where m indicates the number of iterations and $\epsilon$ is the desired accuracy.

4. $T_{ijk}$ is replaced by $T'_{ijk}$ and the process is solved for the next time step.

The estimated new distribution of temperatures is calculated into two ways: (1) A first estimate, with larger cube sizes is determined by explicit formulation at the limit of numerical stability (Eq. 6). If $\delta t$ is chosen to be equal to the right hand side of Eq. (6), the expression for $T'_{ijk}$ is:

$$T'_{ijk} = \sum_{lmn} \frac{T_{lmn}}{p} + \frac{q_{ijk} \delta t}{C} \qquad (12)$$

Thus, if $q_{ijk}=0$, $T'_{ijk}$ is simply the mean value of all its neighbors. For smaller cube sizes, however, a prohibitive amount of CPU time is required. In addition, because the apex cube has only one neighbor, the temperature estimates at the apex are subject to inaccuracies.

Figure 2:
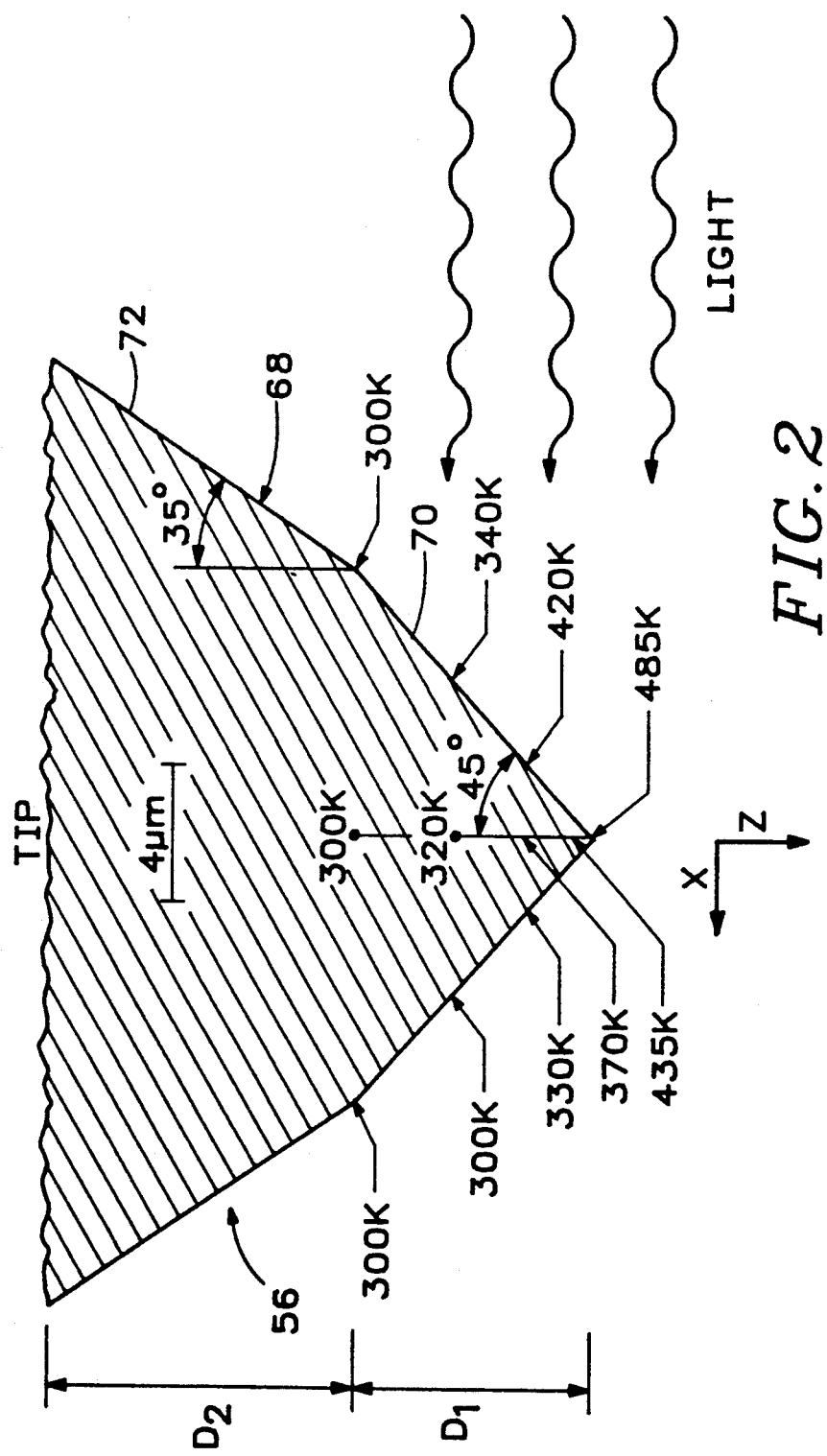

By choosing an appropriate distribution based on the results using larger cube sizes a more accurate apex temperature may be determined. Referring now to FIG. 2, tip 56 is depicted in greater detail, and is shown as a cone 68. A Taylor cone is that shape which a liquid metal will form in the presence of electric stress and surface tension in the absence of liquid flow. A Taylor cone has a steady state half angle of 49.3°. For simplicity, the apex is considered to be a 45° cone 70 for a distance up from the vertex of $z=7\mu m$ (FIG. 2, D$_1$). For those portions of the cone above D$_1$, the angle is assumed to be 35°, as indicated at 72. Additionally, it is assumed that the cone material is composed entirely of liquid gallium, such that $\kappa$ and $c_v$ in Eq. (10) are independent of ijk. Because the thermal conductivity of tungsten is greater than that of gallium, and the heat transfer from a liquid to a solid is usually very good, this simplification leads to an under-estimate of the time response to the laser, however, for the most important laser beam sizes ($\leq 4\mu m$) and laser frequencies $\geq 1$ MHz, there is no under-estimation because there is no significant change at the height where the tungsten needle begins.

The following results were obtained using cube sizes of approximately 1/10 of the laser beam size, $2\omega_0$. The Gaussian intensity distribution of the laser beam was simulated by three discrete power densities corresponding to the areas between $\pm\omega_0$, $\pm 2\omega_0$, $\pm 3\omega_0$.

Figure 3:
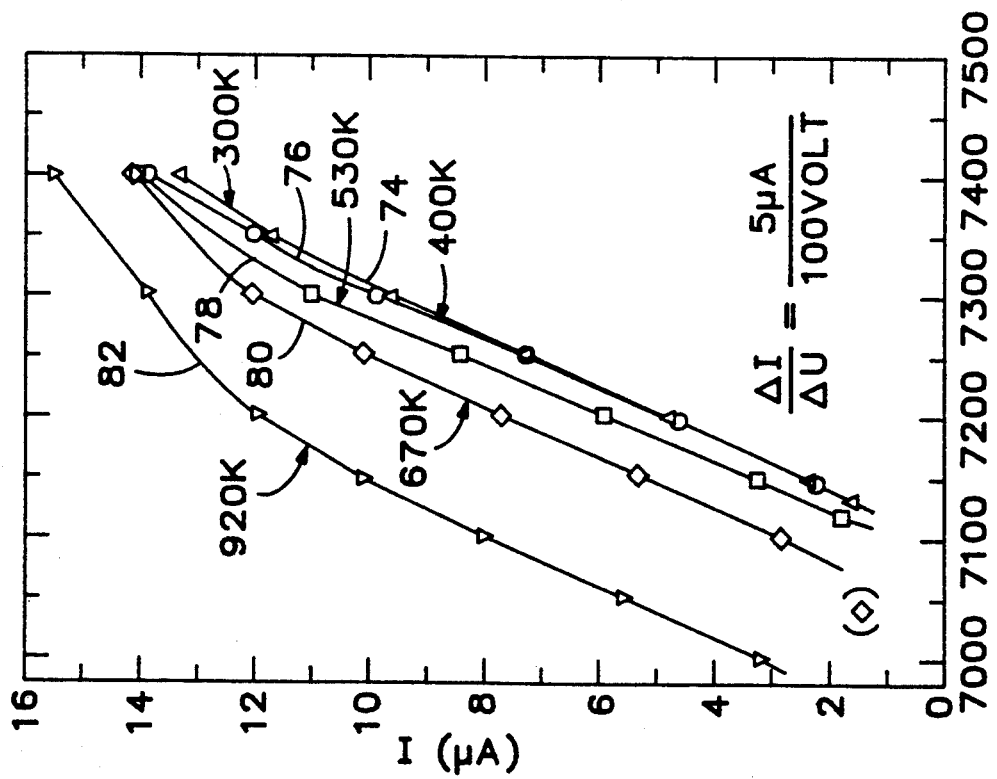
FIG. 3 depicts the current v. voltage for a gallium liquid metal ion source at various source temperatures.

Turning now to FIG. 3, the LMI source characteristics for current and voltage is depicted at several different temperatures. Trace 74 represents an LMI source at 300°K; trace 76 at 400°K; trace 78 at 530°K; trace 80 at 670°K; and trace 82 at 920°K. The different temperatures are caused by ohmic heating of the loop supporting the gallium reservoir. The LMI source is operated continuously during the entire data gathering process because it was determined that the slope and the onset voltage of the designed characteristics were not sufficiently reproducible once the LMI source had been turned off and then turned on.

Figure 4:
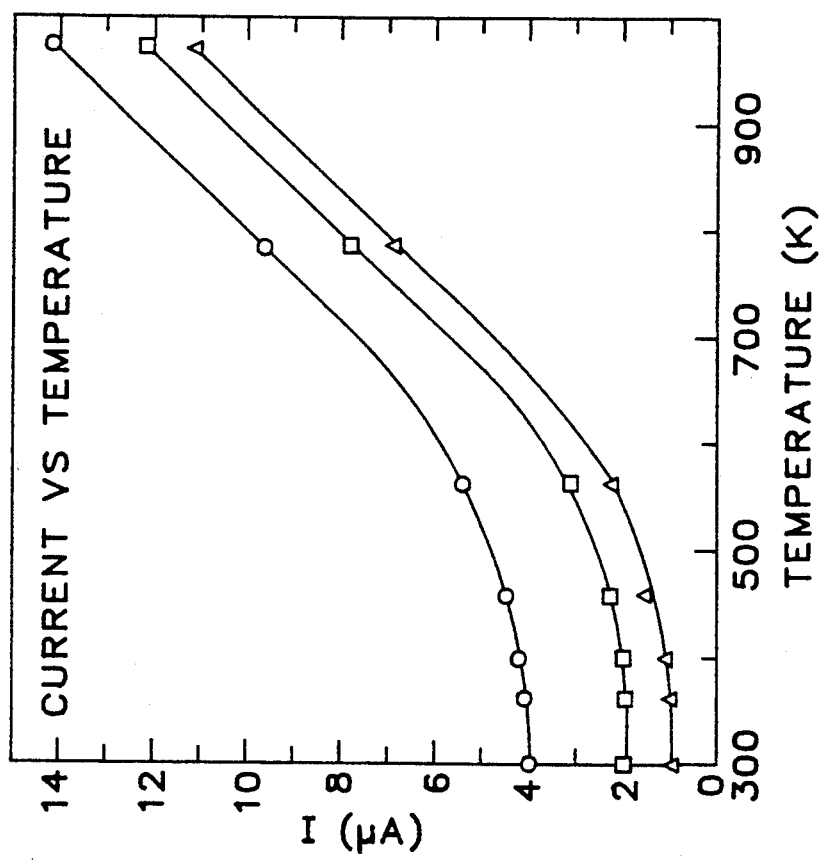
FIG. 4 depicts the current v. source temperature for three separate voltages.

Of particular interest is the relatively parallel orientation of the slopes of the current/voltage characteristics when operated at widely different temperatures. This indicates that a temperature change, $\Delta T$ produces the same change in absolute current, $\Delta I$, for any given current where the current $< 10\mu A$. This feature is depicted in FIG. 4 which illustrates the relationship of current I measured as function of the temperature for different initial currents where the initial temperature of 300°K. If the three curves are overlaid, they coincide.

Figure 5:
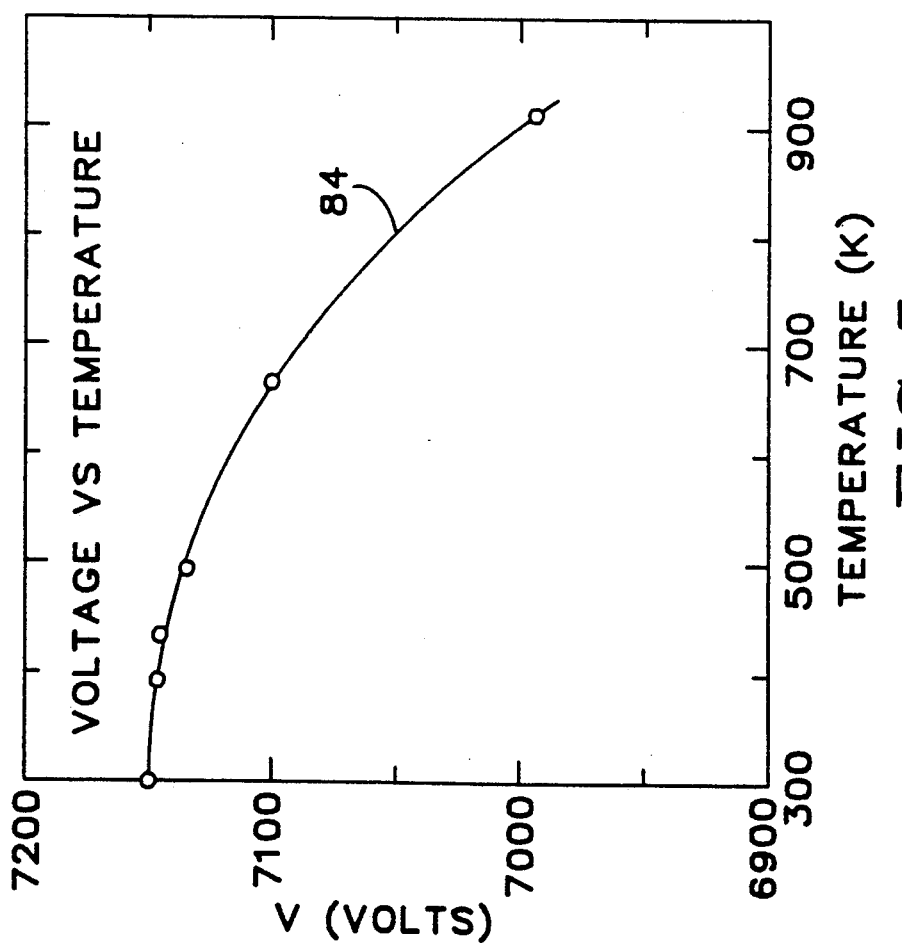
FIG. 5 depicts voltage v. temperature at a constant ion current of $2\mu A$.

Referring now to FIG. 5, the dependence of voltage on the temperature of the constant current of $2\mu A$ is depicted by line 84. In this figure, as in FIG. 4, it can be observed that between 300° K. and 400° K. there appears to be very little change of the voltage associated with a change in temperature.

Figure 6:
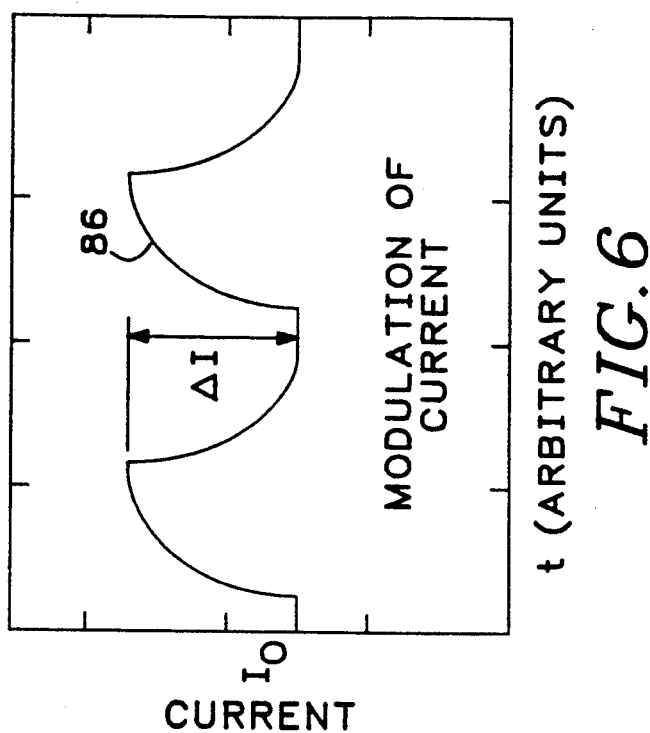
FIG. 6 is a schematic representation of modulation of the liquid metal ion current as affected by the laser beam.

Referring now to FIG. 6, the result of heating the LMI source with the laser is depicted by line 86. The depth of modulation of $\Delta I$ due to the incident laser power was independent of the DC current level $I_0$ between 0.5–10$\mu A$, which indicates that the modulation is additive rather than multiplicative. Therefore, it is possible to modulate currents at 0.5$\mu A$ by 200% ($\Delta I = 1\mu A$), while the modulation at 10$\mu A$ is only 10%. This temperature behavior will be discussed later herein.

In order to determine the time response of the current, it must be determined where exactly on the tip the temperature has to be changed. It is apparent that temperatures greater than 400° K. are sufficient to significantly alter the current, however the exact mechanism by which this happens is unknown. If the supply of material is an important consideration, and the viscosity and film thickness of the liquid metal on the shank has to be altered, there would be no way to obtain modulation frequencies as high as 50 MHz, since the heat dissipation would be by far too slow. If, however, a temperature change at the apex (the emitting region) is sufficient for a given set of circumstances, the time response could be very fast provided the heated volume is small. Although the LMI source is normally activated by heating it with a current supply, it is possible to pulse the LMI source with the extraction of a very low current of a few nA during laser illumination, with the vast majority of the LMI source pulse being produced by a laser beam of beam size of 100$\mu m$ and a frequency of 2 Hz.

In one series of tests, the I/V characteristic of the tip was quite shallow, on the order of 0.6 $\mu A$/100 Volts, suggesting that the tip was almost out of gallium. Generally, such an emitter can be "repaired" temporarily by heating it to 900° K., to wet the solid needle with gallium from the reservoir. The local heating by the laser was apparently sufficient to build up a Taylor cone and to support gallium flow from the shank during such illumination.

Figure 7A:
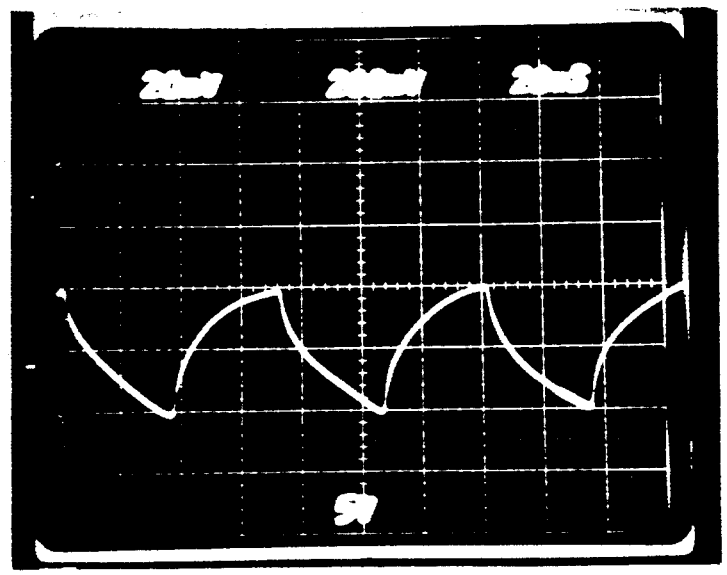
FIG. 7a depicts modulated ion current v. time where the amplitude has been maximized.
Figure 7B:
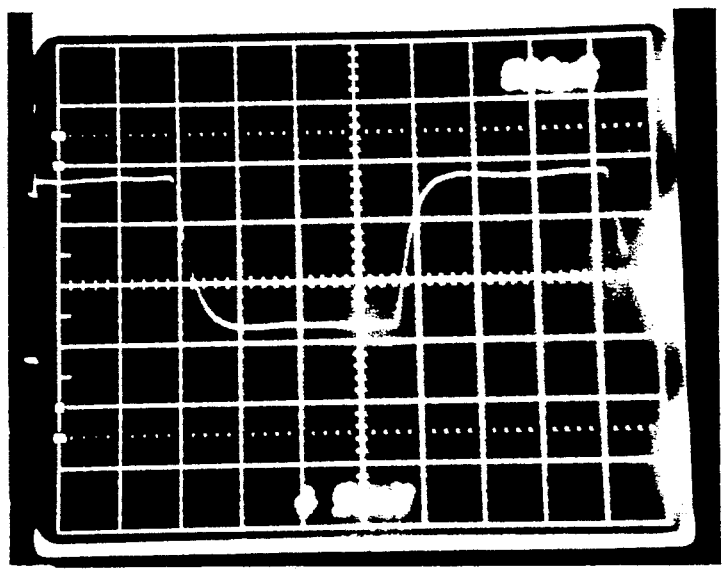
FIG. 7b represents modulated ion current v. time where the frequency response has been maximized.

Referring still to FIG. 6, a schematic diagram of a typical current modulation run is depicted at 86. It is apparent that the apex may be sufficiently heated with the laser beam. The DC level ($I_0$) and the modulation amplitude ($\Delta I$), as indicated in FIG. 6, indicates that the current modulation follows the temperature modulation by the laser linearly. The shape usually follows Eq. (2) during the time of temperature decrease and obeys:

$$T(t) = T_2 + \Delta T(1 - e^{-\lambda t}) \quad (13)$$

during the temperature rise. Here $\Delta T = T_1 - T_2$ is the difference between the asymptotic temperatures. Since the absorption of the light is instantaneous, $\lambda$ is usually larger than $\beta$ (Eq. 2). The parameters $\lambda$ and $\beta$ and the shape of the modulation curve are strongly dependent on the position of the beam, as illustrated in FIGS. 7a and 7b. In 7a, the amplitude is maximized while in FIG. 7b the time response was optimized. If the beam is positioned near the apex, as in 7b, the heated volume and absorbed power are smaller, hence the temperature change is faster and the amplitude smaller. If the beam center is directed further away from the apex, in the region of $D_2$ in FIG. 2, the absorbed power is higher, but there is a time delay in warming up the apex and the temperature decrease is slower since the heated volume is larger.

By measuring the light power behind the tip, it is possible to determine the exact position of the beam center on the tip, since both the shape of the tip and the Gaussian intensity distribution of the laser beam are known. By integrating the two-dimensional Guassian distribution over the tip boundaries, it is possible to determine that the frequency optimized positions resulting in the trace shown in FIG. 7b correspond to $z = -\omega_0/8$ and the amplitude optimized position (FIG. 7a) when $z = -0.65\omega_0$. The amplitude optimized position is virtually independent of the beam diameter $2\omega_0$. Therefore, with a laser spot size of 10–15 $\mu m$, 90% of the absorbed power heats the Taylor cone and only 10% heats the shank, which again illustrates that is unnecessary to heat the tip shank.

Figure 8:
FIG. 8 depicts modulation of the ion current at 100kHz.

FIG. 8 depicts an amplitude maximized trace at a high modulation frequency, on the order of 100 kHz, with a laser beam size of approximately 10 $\mu m$. Although there is some signal noise of a few mV due to the wide bandwidth of the oscilloscope, it can be seen that there is still a considerable potential for increasing the frequency at this beam size.

Figure 10:
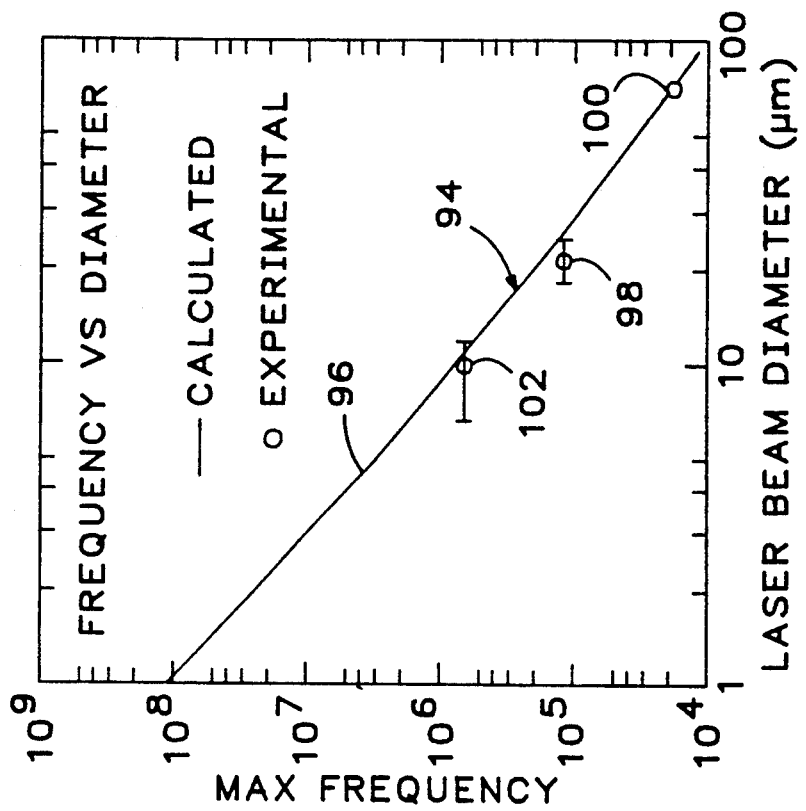
FIG. 10 depicts maximum modulation frequency v. beam diameter.
Figure 9:
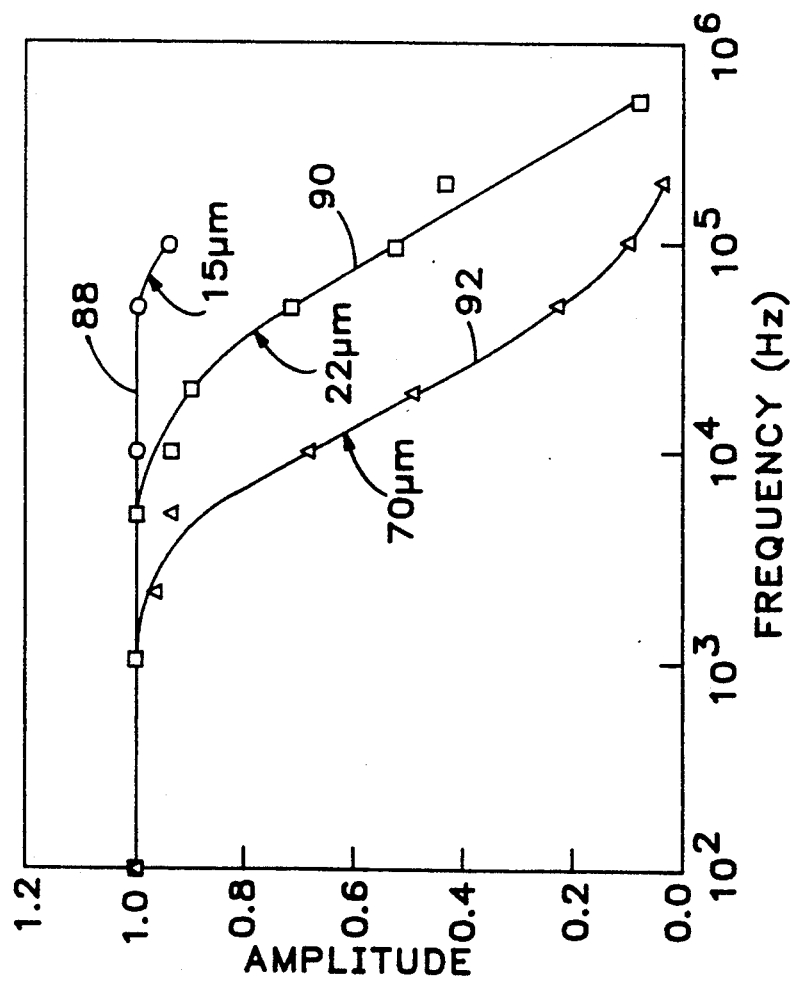
FIG. 9 depicts modulation of ion current amplitude v. frequency for various laser spot sizes.

Referring now to FIG. 9, current amplitude, in $\mu A$, is depicted versus modulation frequency in Hz for beam diameters of 15 $\mu m$ (line 88), 22 $\mu m$ (line 90), and 70 $\mu m$ (line 92). Because the laser could not be chopped in a square wave beyond 100 kHz, the data at and beyond 100 kHz ($10^5$ Hz) must be regarded as an estimated performance only. It should be noted that the frequency at which the amplitude drops to half its original value is approximately that frequency which is expected from a 1/e of its maximum value $\Delta T$. (It is assumed that $\Delta T$ causes a linear change in $\Delta I$, as will be discussed later herein.) The calculated maximum frequency, $f_m$ is shown in FIG. 10, at 94, as a function of the beam diameter. A small bending of the curve occurs at 96 where the beam diameter $\approx 8 \mu m$, where the illuminated liquid cone angle changes from 35°, the underlying structure of the tungsten tip, to the Taylor cone angle (49°). Larger cone angles result in greater heat dissipation, therefore the dependence of the heat loss on cone angle becomes stronger. The experimental values at 22 (98) and 70 $\mu m$ (100) are derived from the data in FIG. 9, while the value at 10 $\mu m$ (102) is estimated from the 1/e drop in FIG. 8. Agreement between the calculated and experimental values for the maximum modulation frequency is sufficient to postulate that a modulation of 50 MHz or more may be achieved with laser beams having a diameter $< 2 \mu m$.

Figure 11A:
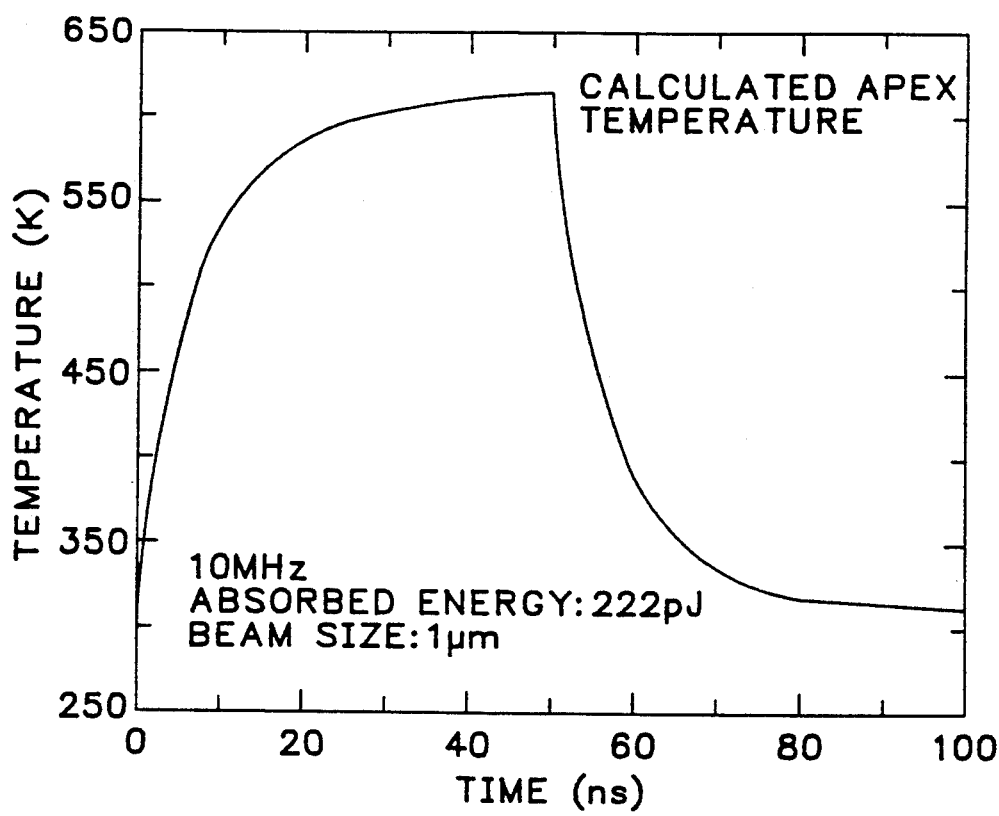
FIG. 11a depicts temperature v. time for a 50 ns pulse.
Figure 11B:
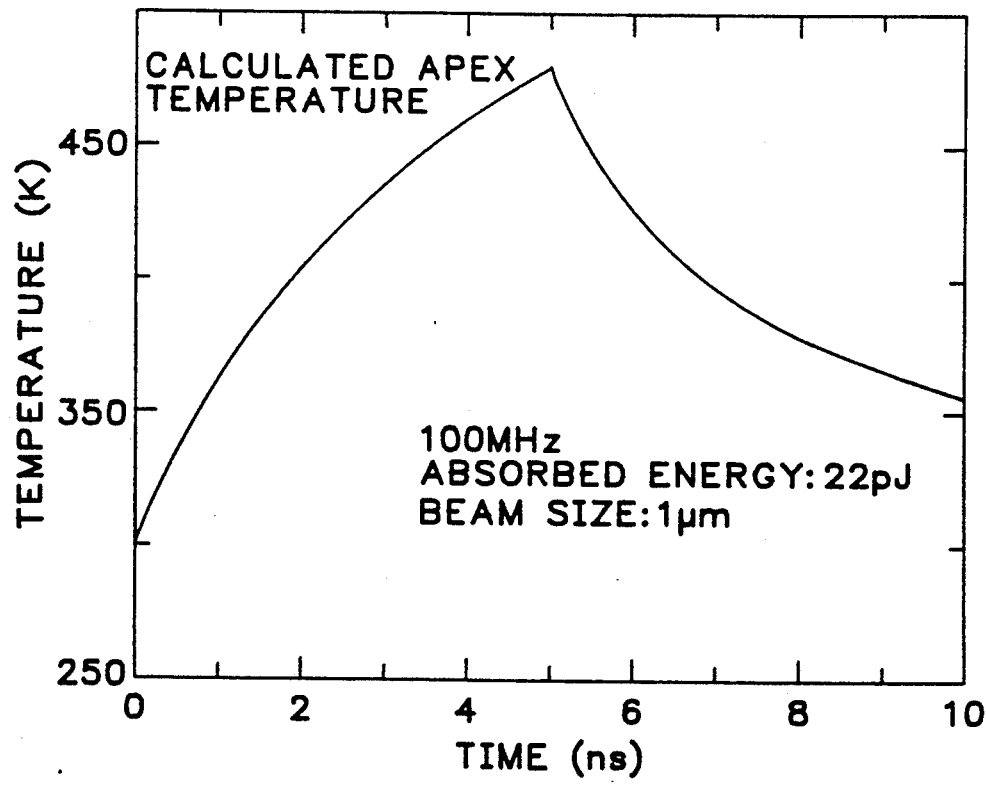
FIG. 11b depicts temperature v. time for a 5 ns pulse.

Referring now to FIG. 11a, the calculated apex temperature derived with a 1 $\mu m$ laser beam diameter having a pulse length of 50 ns. FIG. 11b depicts the same with a pulse length of 5 ns. These behaviors may be extrapolated to any larger beam diameter if the time scale is appropriately extended. The beam center position is at $z = -0.15$ μm (FIG. 2) Because it appears that, as the result of comparing the shape of the current modulation with temperature modulation, the current linearly follows the apex temperature change, it is possible to determine current amplitude based on laser power.

Figure 13:
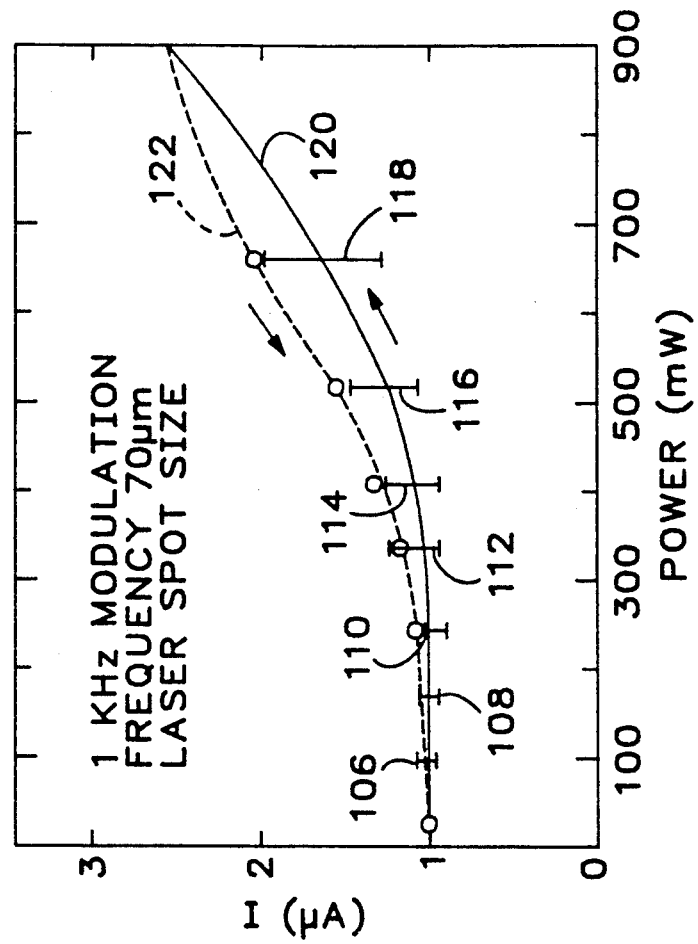
FIG. 13 depicts current v. laser power.
Figure 12:
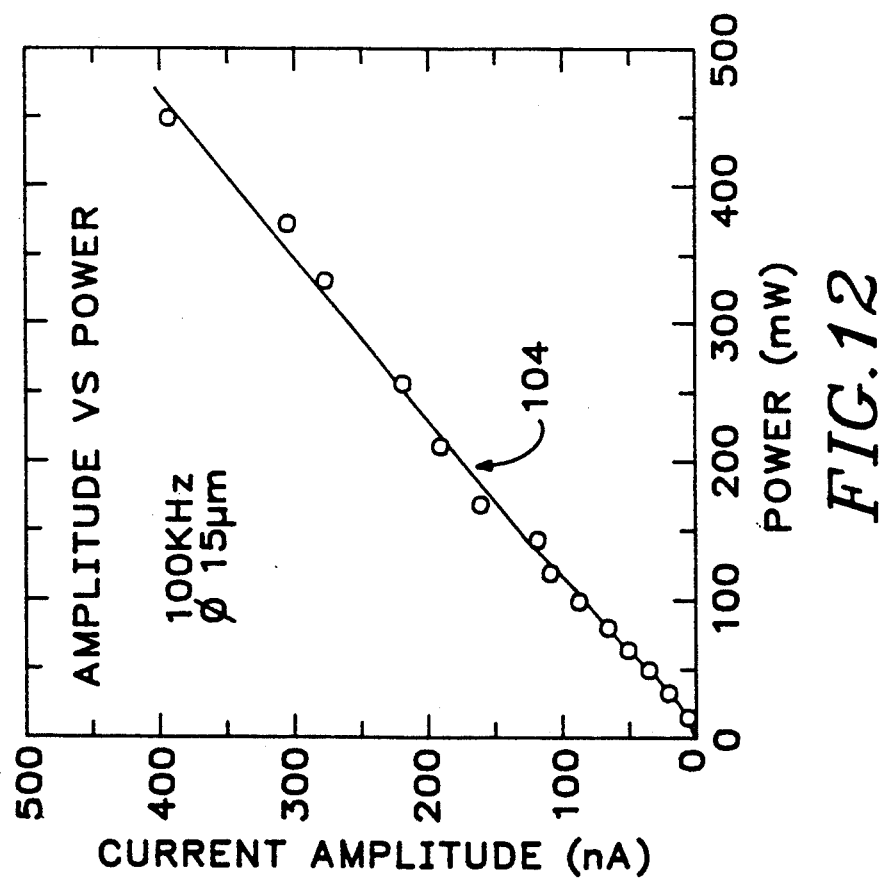
FIG. 12 depicts current amplitude v. incident laser power.

A comparison of current amplitude $\Delta I$ on the power of the laser results in the plot depicted at 104 in FIG. 12, which is nearly a straight line, passing through the origin of the graph. It is known that the heat conduction equation is linear in T and q, therefore, the temperature is a linear function when compared with input laser power. Therefore, $\Delta I$ is linearly dependent on $\Delta T$. There is no threshold voltage, as in FIG. 4 (and no indication of a nonlinear relationship in FIG. 12). The average current during modulation results in precisely the same behavior as observed during measurements taken during loop heating, as in FIG. 4, and is depicted in FIG. 13. In FIG. 13, the modulation amplitude is depicted by bars 106, 108, 110, 112, 114, 116 and 118, while the average ion current is depicted by solid line 120 and broken line 122.

At low laser heating power, below threshold temperature, $I_0$ decreases by $\approx \Delta I/2$ below the DC level without heating, the average current remaining unchanged. There appear to be two quite different effects of temperature on current: one which occurs at the apex of the tip, which always tends to increase the current; and another which is apparently dependent on the overall temperature change of the emitter shank, which tends to decrease the current at lower temperatures and increase it beyond a certain threshold temperature of about 400° K. An effect of the temperature on the shank is also shown by the hysteresis effect for the average current, which is shown in FIG. 13, while there is no hysteresis effect for $\Delta I$. Taken together, the effects do not change the initial slope of the I/V characteristic. This is a very interesting and unexpected result.

Figure 14:
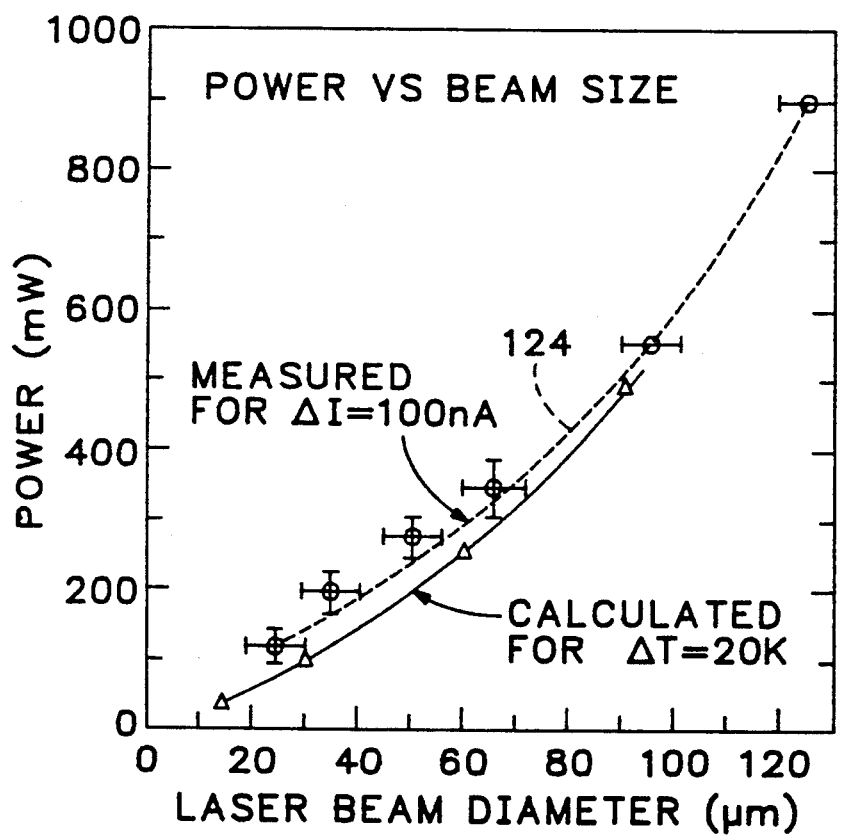
FIG. 14 depicts laser power v. beam diameter for a current modulation of 100 nA.

In order to determine how much power input is necessary at a given laser beam size to obtain sufficient modulation of the LMI source, it was determined how much power was necessary to obtain a given change in current of 100 nA as shown in FIG. 14 by broken line 124. To determine the values, the apex temperature was determined by the amount of energy deposited at the Taylor cone near its apex. Although a quadratic relationship between the necessary power and beam diameter d, would be expected, it should be recognized that there also exists a dependence of the total power absorbed on d due to the shape of the emitter and the relative beam center position. Additionally, thermal loss on the shadowed side of the apex also depends on d. Therefore, it appears that there is a weaker dependence on $d^2$ than might be expected, and this is depicted in FIG. 14. The measured values are in fair agreement with the calculated values, which provide a temperature calibration for the current modulation of $\Delta I/\Delta T = 100$ nA/20K. This also appears to be a reasonable value according to FIGS. 4 and 13. A reflection of 90% was assumed. Due to the varying incident angle of light, the reflection coefficient may be somewhat higher than this for normal incidence.

The non-quadratic dependence indicates that there is no effect of absorbed light on the emitting area, since the amount of light would increase with the square of the beam radius.

Although the description of the actual events which take place during ion formation during an LMI source is largely theoretical, the following is believed to be a relatively accurate description of the events which take place during ion formation.

When a high voltage is applied to an LMI source, the shape of the liquid on the needle changes. If no voltage is applied, the shape of the liquid is determined only by the surface tension stress, which tends to flatten out the surface. When high voltage is applied there is an electrostatic stress which tends to pull the material to a point where there will be a high field strength. To achieve equilibrium, both of the stresses have to be equal, therefore:

$$\gamma \left( \frac{1}{r_1} + \frac{1}{r_2} \right) = \frac{1}{2} \epsilon_0 F^2 \tag{14}$$

which is called the "Taylor" condition. F is the field strength, $\gamma$ is the surface tension and $r_{1,2}$ are the principle radii of curvature of the liquid metal tip, and $\epsilon$ is the permittivity constant, the dielectric constant of a vacuum, $8.85 \cdot 10^{-12}$ Farad/m. A Taylor cone, which is defined as a cone having a half angle of 49.3°, is the only shape of interest wherein both stresses are equal over the entire surface.

As soon as ion emission begins, mass flow takes place and the static case equilibrium condition, described by Eq. (14), must then be replaced by the dynamic equilibrium condition, which is described by:

$$\gamma \left( \frac{1}{r_1} + \frac{1}{r_2} \right) + \frac{1}{2} \rho v^2 = \frac{1}{2} \epsilon_0 F^2 \tag{15}$$

where the negative internal pressure of Bernoulli flow ($\frac{1}{2}\rho V^2$) has been included. It has been empirically determined that the overall shape in the dynamic case is close to that of a Taylor cone, although the experimental data varies with the underlying structure of the liquid metal. The cone does not end in the unphysical geometrical vertex, but in a jet-like protrusion, which increases proportionally to the applied current. The radius of this protrusion is only a few nm at low currents. At its apex, the field strength reaches values of more than 10 V/nm, leading to field evaporation of the liquid metal atoms. The field evaporation rate is strongly temperature dependent, and the current approximately given by:

$$I_{FE} = 2\pi r_a^2 \left( \frac{\nu}{\sigma} \right) \exp(-Q(F_a)/\kappa T) \tag{16}$$

where $F_a$ is the field strength above the protrusion having radius $r_a$, $Q(F_a)$ is the activation energy for field evaporation, T is the apex temperature, v is the surface atomic vibration frequency and $\sigma$ is the area of a surface atomic site.

It may be that the apex temperature is higher than the substrate temperature, especially at high currents, $>10$ μA, due to the energy input by field ionization and the relaxation energy of the liquid when a surface atom is removed. It may also be that the apex field is mainly controlled by a space charge because of extreme current density on the apex. This indicates that an increase in current leads to an increase in space charge and consequently to a decrease in surface field. It has been suggested that I is depended on $r_a^2$, which may mean that either $Q(F_a)/\kappa T \approx 0$, or the apex field remains constant if the voltage is changed. Utimately, field apex measurements based on post-ionization suggest that an increase of the apex field up to total current of 10 μA, with a constant field for higher currents, i.e. further increases in current are due to an increase in emitting area as evidenced by the increase in the width of the current angular distribution.

Because of the space charge, Eq. (16) does not give the dependence of I on V. An equation for the current from a capillary LMI source, based on Eq. (15) and relating the field with and without space charge to the current density is:

$$I = \frac{3\pi(2e/m)^{\frac{1}{2}}R\gamma\cos\phi}{V^{\frac{1}{2}}} \left( \frac{V^2}{V_0^2} - 1 \right) \quad (17)$$

where R is the radius of the capillary, $\phi$ the cone angle and $V_0$ the threshold voltage, where the emission starts, and which is defined by:

$$V_0 = (2\kappa R\gamma \cos \phi/\epsilon_0)^{\frac{1}{2}} \quad (18)$$

where $\kappa$ is a numerical constant depending on the geometry and is in the order of 3–5. Eq. (18) results from the counterbalance of surface tension and electrostatic stress (see Eq. (14) over the entire surface. Though capillary LMI sources have a very low flow impedance, and hence unrestricted mass flow compared to the ion current, Eq. (18) is also applicable for the needle-type LMI source.

An equation which may be used with both types of LMI sources, is based on a model which considers the force acting on the emitter and on the collector, both of which are considered to be a closed mechanical system:

$$I = \left( \left( \frac{2mV}{q} \right)^{\frac{1}{2}} + \frac{m}{q\rho} \sum_i G_i Z_i \right)^{-1} H(V, F_a, F_T) \quad (19)$$

Eq. (19) is basically the same as Eq. (17), except a term accounting for the supply to the needle is included. H is the force acting on the collector minus the force acting on the non-emitting part of the emitter $F_a$ and the surface tension force $F_T$, H is generally proportional to $V^2$, G characterizes the geometry of the emitter and film, while Z is the flow impedance. The parameter i denotes the different geometrical parts of the emitter. Both G and Z are, in general, dependent on the film thickness of the liquid. The first term in the denominator of Eq. (19) dominates under space charge limitations, while the second one under flow or supply limitations. It is believed that the film thickness plays a very important role in Eq. (19), and additionally determines whether the source is supply or space charge limited. It is also believed that the film velocity on the shank does not change with increasing current but only as a result of changes in the film thickness. Other work suggests that the pressure gradient along the cone shank is such that the flow of material is directed away from the apex. Hence, the microcapillary forces supply the liquid to the apex, which forces do not depend on the macroscopic electric field distribution.

Initially, the influence of the temperature on the field of evaporation rate is believed to give the strongest effect due to the exponential dependence, as stated Eq. (16). If ln(I) is plotted vs 1/T, assuming that apex and base temperatures are identical, for t>400K, Q(F)≈0.1 eV is obtained for Gallium, depending on the applied voltage. Solving Eq. (16):

$$\frac{\Delta I}{\Delta T} = I \frac{Q(F)}{\kappa T^2} \quad (20)$$

Since $\Delta I/\Delta T$ was constant at a given temperature for I=0.5–10 μA, Q(F) has to be decreased by a factor of 20 to explain the experimental results. This, however, disagrees with the ln(I) vs 1/T plots, where the change of Q(F) over this range was typically only a factor of 2. Additionally, it is quite arbitrary to assume that Q(F) changes at different temperatures and currents so as to yield a constant $\Delta I$. Furthermore, according to Eq. (16), $\Delta I/\Delta T$ is far from being constant when Q(F)≈0.1 eV. In the case where only the apex temperature was modulated (FIG. 12), however, a clear linear dependence of $\Delta I$ on $\Delta T$ was shown.

If the apex temperature is dependent on the current due either to electron impact from field ionization or relaxation of the liquid, a change in temperature would cause a larger change in $\Delta I$ than suggested by Eq. (20) because there would be an additional energy input to the apex with $\Delta I$. If this effect were significant, however, $\Delta I/\Delta T$ could not be constant at any given voltage as measured.

Because the apex radius, $r_a$, changes with temperature due to the change in surface tension, the situation is significantly complicated, since the plots of ln(I) vs 1/T are effected as well. Eq. (16) does not appear to adequately describe the experimental results, displayed in the figures herein, which depict a linear relationship between $\Delta I$ and $\Delta T$ with (Eq. 16). In order to provide a linear relationship between $\Delta I$ and $\Delta T$, $r_a$ has to be reduced for higher temperatures and hence higher currents, which seems somewhat arbitrary, because, properly, $r_a$ should be reduced for the entire range of temperature and currents.

An explanation of the foregoing is that the surface tension at the apex must play an important role. Due to the counterbalance of electrostatic and surface tension stress at threshold voltages, as described in Eqs. (14) and (18), the threshold voltage is dependent on the square root of the surface tension, $\gamma$. If $\gamma$ decreases with increasing temperature, the threshold voltage should decrease and the I/V characteristic should be shifted towards lower voltages, while the slope remains nearly unchanged, as can be seen from Eq. (17). This conforms with the experimental results. However, there exists considerable confusion in the literature about the temperature dependence of $\gamma$, therefore the error of the data is too large to definitely establish the surface tension dependence. While the values of $\gamma$ in the literature vary only by about 1%, the absolute change of $\gamma$ with $\Delta T=100K$, for example, varies by a factor of 30 from $3.7 \cdot 10^{-4}$ N/m to $10^{-2}$ N/m. For purposes of this discussion, $\gamma$ has a value of 0.73 N/m.

In any case, the change is small in the range of temperatures under consideration and $V_0$ may be considered to vary as:

$$V_0(T) = V_{ox}\left(1 - \frac{1}{2} \frac{d\gamma/\gamma}{dT} \Delta T\right) \quad (21)$$

Because, for small currents, $V \approx V_{0x} \approx V_0(T)$, the voltage dependent terms in Eq. (17) may be approximated by:

$$\frac{1}{V^{\frac{1}{2}}}\left(\frac{V^2}{V_0^2(T)} - 1\right) \approx \frac{1}{V_{ox}^{3/2}} 2(V - V_0(t)) \quad (22)$$

If V is held constant and $V_0(T)$ is changed linearly with temperature, as in Eq. (20), it is reasonable that the current in Eq. (17) will vary linearly with temperature, as measured and depicted in FIG. 12. When an absolute change of $10^{-3}$ N/m is used for $\Delta T = 100$ K, $V_{0x}$ is reduced by 10 volts ($V_{0x} = 8$ kV). If the observed slope for the emitter (FIG. 13) is described as $dI/dV = 4 \mu A/100$ Volts, a current increase of 400 nA is produced. This value is consistent with the results of FIG. 14, where a temperature calibration for the current modulation $\Delta I/\Delta T = 100$ nA/20K.

There are indications that the temperature effect at the very end of the tip is caused by the change of surface tension near the apex. This supposition explains our observations of the modulation amplitude by laser heating. It should be mentioned that the dependence $V_0^2 \propto \gamma$ is independent of the shape of the very end of the tip, since it is based only on the counterbalance of electrostatic and surface tension stress, and not mass flow.

Since the surface tension at the apex always tends to increase the current with temperature, and since the experimental data shows no change with temperature up to 400° C. during heating of the whole emitter structure, there must be another effect on the shank which tends to decrease the current up to 400° C. and then causes it to increase. It is known to those skilled in the art that the current often increases when the temperature is lowered when a needle-type alloy LMI source is used.

Effects which are due to thermal expansion which might change the geometry of the emitting area are considered to be too small and suggest that the effects must be looked for in the supply of material. Both the viscosity and the film thickness change with temperature. Because the flow impedance is proportional to the viscosity, the supply of material will be affected by the temperature. For most materials, the temperature dependence of the viscosity is described by:

$$\log \mu = A \frac{10^3}{T} - B \quad (23)$$

when $\mu$ is expressed in mNs/m$^2$, and T in K, and where A and B are constants. This means that the viscosity changes more rapidly at lower temperatures. In the experiments depicted in FIGS. 3 and 4, it is indicated that the current change is more rapid at higher temperatures, implying that the viscosity change is not the only effect.

Apparently, when the temperature of the shank is increased, the film thickness grows because of the increased metal supply. This increase in film thickness may simultaneously change the geometry of the liquid cone, i.e. increasing the base diameter and hence the cone angle. This would increase the threshold voltage and thus cancel the decrease in threshold voltage due to surface tension. It is known that for lower substrate cone angles, <30°, the threshold voltage increases by 500 Volts per 1 $\mu$m increase in emitter radius. Because the effective radius is also determined by the film thickness, the film thickness has to be increased only by about 20 nm to offset a 10 volt drop of the threshold voltage due to the surface tension of the film thickness. A similar argument could be based on the cone angle. A very small change in film thickness, on the other hand, makes it possible that the slope of the I/V curve is not significantly changed. If the temperature is increased further, the effect of surface tension may dominate the effect of film thickness so the current will increase.

It may also be concluded that because the viscosity is significantly changed by temperature changes of a few hundred degrees (at 650K, $\mu$ is reduced by half for Gallium) and the increased liquid metal supply suggests that the film thickness is at least not diminished by the temperature increase, the impedance Z is certainly changed significantly. This in turn indicates that the supply term in Eq. (19) must be smaller than the space charge term, otherwise the slope would also change significantly with temperature. This is true regardless of the special supply function, since all kinds of volume flow including flow by capillary forces are a function of the inverse of the viscosity. The dominance of the space charge term means that the film thickness on the cylindrical part of the needle is $>>0.1$ $\mu$m.

It is known that field evaporation is the only process for ionization which can explain the low current regime of a LMI source. However, at higher currents, or higher temperatures, field ionization cannot be excluded. At temperatures >400K, field ionization makes a considerable contribution to the total current. Field ionization may take place by thermal evaporation of neutral atoms followed by immediate ionization at the critical distance for field ionization. If the ionization is complete, the ionization rate will depend only on temperature, which would indicate that $\Delta I$ depends only on temperature. However, because the activation energy for thermal evaporation is very high, on the order of a few eVs, there is an extremely strong exponential dependence on temperature, and both the linearity with laser power and, in turn, temperature and the existence of a minimum temperature change in I with loop heating may not be adequately explained. This indicates that field ionization is not a significant ionization mechanism, i.e. >10% of the total current, for currents <10 $\mu$A and temperatures <900K.

Thus, a method and apparatus for modulating an LMI source to provide a modulated ion beam column has been disclosed. The method and apparatus have applications to focused ion beam micromachining and milling operations. Although a preferred embodiment of the method and apparatus have been disclosed, it should be appreciated that further variations and modifications may be made thereto without departing from the scope of the invention.

This work was supported by The Oregon Graduate Institute of Science and Technology Provost's Office under grant 18-71.

What we claim is:

1. A method of modulating a liquid metal ion source comprising:
   generating an ion beam with the liquid metal ion source;
   generating a light beam with a light source;

focussing the light beam;

directing the focused light beam at the liquid metal ion source;

adjusting the location of the directed light beam relative to the liquid metal ion source; and inducing a modulation in the ion beam by modulating the light beam.

2. The method of claim 1 wherein said directing includes aiming the light beam at the tip of the liquid metal ion source.

3. A method of modulating a liquid metal ion source comprising:

generating an ion beam with the liquid metal ion source; and modulating the ion beam by modulating the temperature of the liquid metal ion source with a modulated light beam.

4. The method of claim 3 wherein said modulating includes aiming the light beam at the tip of the liquid metal ion source.

5. Apparatus for modulating an ion beam source which is generated by a liquid metal ion source, comprising:

a light beam source for generating a light beam and projecting said light beam along a light beam path;

a modulator for modulating said light beam located in said light beam path; and means for directing the modulated light beam to the liquid metal ion source.

6. The apparatus of claim 5 wherein said modulator includes an acousto-optic modulator.

7. The apparatus of claim 6 wherein said modulator includes a signal generator for controlling the rate of modulation of said modulator.

8. The apparatus of claim 7 which includes a collector, for collecting a current generated by the ion beam, an amplifier, for amplifing the generated ion beam current, and a signal comparator, for comparing the signals from said signal generator and from said collector.

9. Apparatus for modulating an ion beam which is generated by a liquid metal ion source comprising:

a light beam source for generating a light beam;

a modulator for modulating said light beam located in the path of said light beam; and means for directing the modulated light beam to the liquid metal ion source, thereby heating the liquid metal ion source to produce a modulated ion beam.

10. The apparatus of claim 9 wherein said modulator includes an acousto-optic modulator.

11. The apparatus of claim 9 wherein said modulator includes a signal generator for controlling the rate of modulation of said modulator.

12. The apparatus of claim 11 which includes a collector, for collecting a current generated by the ion beam, an amplifier, for amplifing the generated ion beam current, and a signal comparator, for comparing the signals from said signal generator and from said collector.

* * * * *

UNITED STATES PATENT AND TRADEMARK OFFICE
CERTIFICATE OF CORRECTION

PATENT NO. : 5,015,862

DATED : May 14, 1991

INVENTOR(S) : J. FRED HOLMES, JONATHAN H. ORLOFF and KARL J. JOUSTEN

It is certified that error appears in the above-identified patent and that said Letters Patent is hereby corrected as shown below:

In column 4, line 21 change "f" to --$f$--; line 23 change "$e^{-2}$" to --$\underline{e}^{-2}$--; line 24 change "f" to --$f$--.

In column 5, line 38, replace "$T(x,y,z,t + \delta t) = T_{ijk}$" with --$T(x,y,z,t + \delta t) = T'_{ijk}$--; lines 44-45 <u>replace</u>:

$$T_{ijk} = T_{ijk} + \delta t \left( \sum_{lmn} \frac{T_{lmn} - T_{ijk}}{RC} + \frac{q_{ijk}}{C} \right)$$

<u>with</u>:

$$T'_{ijk} = T_{ijk} + \delta t \left( \sum_{lmn} \frac{T'_{lmn} - T'_{ijk}}{RC} + \frac{q_{ijk}}{C} \right)$$

lines 60-63 <u>replace</u>:

$$T_{ijk} = \frac{T_{ijk} + \delta t \left( \sum_{lmn} \frac{T_{lmn}}{RC} + \frac{q_{ijk}}{C} \right)}{1 + p \frac{\delta t}{RC}}$$

UNITED STATES PATENT AND TRADEMARK OFFICE
CERTIFICATE OF CORRECTION

PATENT NO. : 5,015,862

DATED : May 14, 1991

INVENTOR(S) : J. FRED HOLMES, JONATHAN H. ORLOFF and KARL J. JOUSTEN

It is certified that error appears in the above-identified patent and that said Letters Patent is hereby corrected as shown below:

with:

$$T'_{ijk} = \frac{T_{ijk} + \delta t \left( \sum_{lmn} \frac{T'_{lmn}}{RC} + \frac{q_{ijk}}{C} \right)}{1 + p \frac{\delta t}{RC}}$$

In column 6, line 10 replace "$|(T_{ijk})_{m+1} - (T_{ijk})_m| \leq \epsilon$" with -- $|(T'_{ijk})_{m+1} - (T'_{ijk})_m| \leq \epsilon$ --.

In column 8, line 49 replace "1/e" with --$1/e$--; line 51 replace "$f_m$" with --$f_m$--; line 61 replace "1/e" with --$1/e$--.

In column 10, line 41 replace "($\frac{1}{2}\rho V^2$)" with --($\frac{1}{2}\rho v^2$)--.

In column 11, line 33 replace "(see Eq. (14)" with --(see Eq. 14)--.

Signed and Sealed this

Seventh Day of July, 1992

Attest:

DOUGLAS B. COMER

*Attesting Officer*  *Acting Commissioner of Patents and Trademarks*